United States Patent
Kawabe et al.

(10) Patent No.: US 7,301,405 B2
(45) Date of Patent: Nov. 27, 2007

(54) PHASE LOCKED LOOP CIRCUIT

(75) Inventors: Manabu Kawabe, Hachioji (JP); Kazuyuki Hori, Tokyo (JP); Satoshi Tanaka, Kokubunji (JP); Yukinori Akamine, Kokubunji (JP); Masumi Kasahara, Takasaki (JP); Kazuo Watanabe, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/202,266

(22) Filed: Aug. 12, 2005

(65) Prior Publication Data
US 2006/0049878 A1  Mar. 9, 2006

(30) Foreign Application Priority Data
Sep. 9, 2004  (JP) .............................. 2004-262875

(51) Int. Cl.
*H03L 7/00* (2006.01)
(52) U.S. Cl. ..................... 331/16; 331/34; 331/17; 331/177 R; 331/177 V; 331/117 R; 327/156
(58) Field of Classification Search ............... 331/16, 331/34, 175, 17, 177 R; 327/156
See application file for complete search history.

(56) References Cited
U.S. PATENT DOCUMENTS
6,130,561 A * 10/2000 Dufour ....................... 327/105
6,630,868 B2 * 10/2003 Perrott et al. ................ 331/17
2006/0220750 A1 * 10/2006 Akamine et al. ............. 331/16

OTHER PUBLICATIONS

Hegazi, Ernad, et al., A 17-mW Transmitter and Frequency Synthesizer for 900-MHz GSM Fully Integrated in 0.35-μm CMOS, IEEE Journal of Solid-State Circuits, May 2003, vol. 38, No. 5, pp. 782-792.

* cited by examiner

*Primary Examiner*—Arnold Kinkead
(74) *Attorney, Agent, or Firm*—Reed Smith LLP; Stanley P. Fisher, Esq.; Juan Carlos A. Marquez, Esq.

(57) ABSTRACT

The present invention provides a PLL circuit containing a loop gain circuit capable of suppressing loop gain variation. This PLL circuit includes a counter that is driven by a voltage controlled oscillator within the PLL circuit, an accumulator (ACL) that accumulates the output of the counter, and a comparison operation circuit block that compares the count value of the ACL and the design value pre-stored in a register, and the loop gain of the PLL circuit is detected taking advantage of the fact that the ACL count value is inversely proportional to the loop gain. Based on the detection result, the loop gain is calibrated by correcting the loop gain with a charge pump current, etc. This allows the PLL circuit to maintain stable loop characteristics that will not affect the characteristics variation of each element constituting the PLL.

11 Claims, 15 Drawing Sheets

US 7,301,405 B2

PHASE LOCKED LOOP CIRCUIT

CLAIM OF PRIORITY

The present application claims priority from Japanese application JP 2004-262875 filed on Sep. 9, 2004, the content of which is hereby incorporated by reference into this application.

FIELD OF THE INVENTION

The present invention relates to a loop characteristics detection circuit in a phase locked loop (PLL) circuit, and more specifically to a loop gain detection method of the PLL circuit and a transceiver circuit containing a loop gain detection circuit that is based on the loop gain detection method.

BACKGROUND OF THE INVENTION

For wireless transmitters, frequencies used for transmission are determined and it is required to have a certain frequency accuracy so as not to have adverse effects on apparatuses employing neighboring frequency bands. Particularly, for cellular and automobile telephones, a severe frequency accuracy is required to allow a large number of terminals to use the frequency. Since this frequency accuracy exceeds the accuracy of a high frequency oscillator, the frequency accuracy of the high frequency oscillator is improved by configuring a PLL circuit using a device having a high frequency accuracy, such as a crystal oscillator, as a reference signal. A PLL-based transmitter circuit can be configured in various ways as shown in FIGS. 3 to 5 of the non-patent document 1, and the configuration shown in FIG. 5 of the same is known as the $\Sigma\Delta$ configuration (also called the delta sigma configuration, but the $\Sigma\Delta$ configuration is used herein), which is a configuration suitable for higher integration and lower power consumption.

In the configuration shown in FIG. 5, a block labeled as VCO is a voltage controlled oscillator, which detects phase difference from a reference signal (fREF) through a phase detector (PD), and drives a control terminal of the VCO via a loop filter (LF) in order to control this frequency. Also, a charge pump circuit (not shown in the above document) may be inserted immediately before the LF to convert a PD output signal into a current value.

The phase detector compares two inputs and thus the both inputs must be the same in frequency. However, since frequencies of the crystal oscillator (for example, 13 MHz) used as a reference signal are lower than those used for cellular or automobile telephones (for example, about 900 MHz), the both inputs are matched by dividing the output of the VCO. For instance, if the reference signal is at 13 MHz, the VCO oscillates at 910 MHz to provide the same frequency accuracy as the reference frequency, when the frequency divider ratio is 70.

For cellular and automobile telephones, since a large number of terminals use radio waves, the individual terminals are controlled to avoid interference with each other by using different frequencies or by time sharing. For example, GSM (Global System for Mobile Communications) compatible cellular telephones set their channels at 200 kHz intervals, thus making it necessary to set the oscillating frequency of the VCO in increments of 200 kHz. However, since frequency divider ratio is an integer and the VCO frequency must be an integral multiple of a reference frequency, fine frequency setting is impossible. Therefore, it is necessary to generate pseudo intermediate frequencies by varying the frequency divider ratio in small increments. For example, if the frequency divider ratio is varied like 69, 70, 69, 70, it is possible to cause the VCO to oscillate at a frequency that is 69.5 times the reference frequency. This process of varying the frequency divider ratio is called $\Sigma\Delta$ modulation (or delta sigma modulation); the former designation ($\Sigma\Delta$) is used herein.

Since using the $\Sigma\Delta$ modulation for frequency divider ratio allows fine control of frequency, fine frequency variation by modulating transmit data, as well as channel frequency setting can be implemented. This allows the configuration shown in FIG. 5 of the non-patent document 1 to be more of a full-featured modulator than a simple oscillator.

Not-patent document 1: E. Hegazi, A. A. Abidi, A 17-mW Transmitter and Frequency Synthesizer for 900-MHz GSM Fully Integrated in 0.35-um CMOS, IEEE Journal of Solid-State Circuits, Vol. 38, No. 5 pp. 782-792 May 2003.

SUMMARY OF THE INVENTION

The prior art described above is suitable for the transmitter having a PLL circuit and a modulator, but the modulation accuracy of the transmitter is determined by the degree of accuracy of each elements composing the PLL. For cellular and automobile telephones, higher modulation accuracy, as well as higher frequency accuracy, is required. In the prior art, for example, a means for varying the element values with switches is provided but a function of detecting the PLL characteristics is not provide, thus making it necessary to externally measure the PLL characteristics and adjust accordingly, as shown in FIG. 13 described below in the embodiments of the present invention. In this method, considerable man-hours are required and also a problem of changes caused by temperatures and aging after shipment of the apparatus cannot be addressed.

Therefore, an object of the present invention is to provide a PLL circuit containing a loop detection circuit capable of measuring PLL characteristics easily and with a high degree of accuracy. Another object of the present invention is to provide a PLL circuit that will have stable loop characteristics by performing calibrations based on the measurement of the PLL characteristics.

Still another object of the present invention is to provide a transmitter circuit containing a PLL circuit having a loop characteristics detection circuit.

One representative embodiment of the present invention is as follow:

A phase locked loop circuit according to the present invention includes a first voltage controlled oscillator; a first frequency transform circuit to which the output of the first voltage controlled oscillator is connected; a first phase detector to a first input of which the output of the first frequency transform circuit is connected, and to a second input of which a first reference signal is connected; a first charge pump circuit to which the output of the first phase detector is connected; and a first loop filter to which the output of the first charge pump circuit is connected, wherein the output of the first loop filter is connected to a frequency control terminal of the first voltage controlled oscillator, the phase locked loop circuit further comprising:

a first counter circuit to which the output of the first voltage controlled oscillator is input;

a first accumulator circuit to which the output of the first counter circuit; and a first loop characteristics detection circuit that detects the loop characteristics of the phase locked loop circuit based on the result obtained by integrating the output of the first counter circuit through the first accumulator circuit.

The present invention measures the variation in elements by means of a simple circuit, and performs an operation to compensate for the variation. The variation in the characteristics of each element affects the PLL loop gain, and the loop gain variation results in deteriorated modulation accuracy. However, since the accumulation of the variation of each element becomes the variation of gain, it is not necessary to measure the element characteristics individually, instead, the accumulated variations are measured. In other word, more accurate loop characteristics can be achieved by measuring the loop gain with the counter and accumulator and then compensating for the loop gain with a charge pump current or the like.

Providing the loop gain detection circuit enables the charge pump current to be variable based on the measurement result of the PLL circuit loop gain, which makes it possible to compensate for the element characteristics variation, temperatures, and aging, and thereby to maintain the loop gain constant and increase the degree of modulation accuracy. Moreover, the loop gain detection circuit of the present invention can be composed of digital circuits entirely, thus allowing higher integration and lower power consumption.

DETAILED DESCRIPTION OF THE PREFERRED EMBODIMENTS

Preferred embodiments of the present invention will be described in detail with reference to the accompanying drawings.

Figure 1:
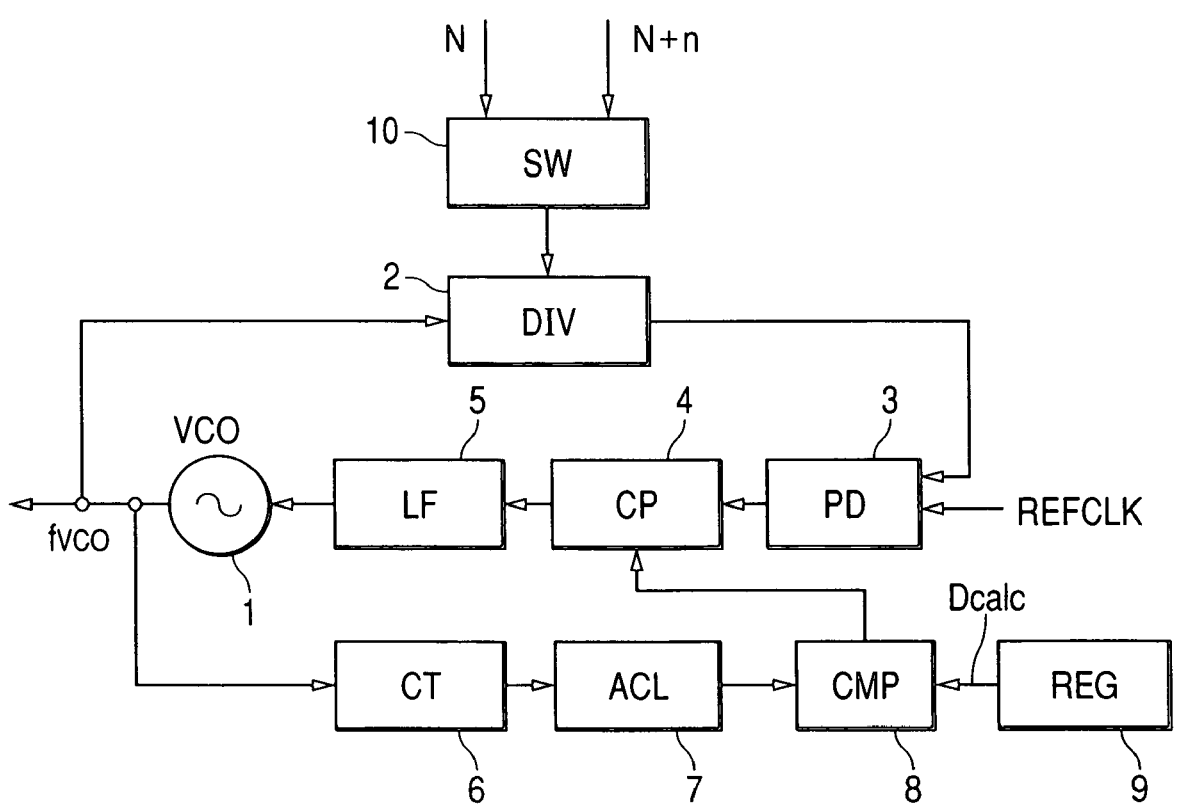
FIG. 1 shows a first embodiment of the present invention.
Figure 2A:
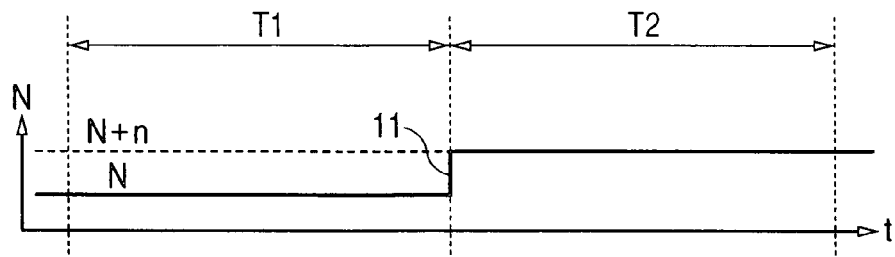
FIG. 2 shows the operation of a counter circuit and an accumulator circuit shown in FIG. 1.
Figure 2B:
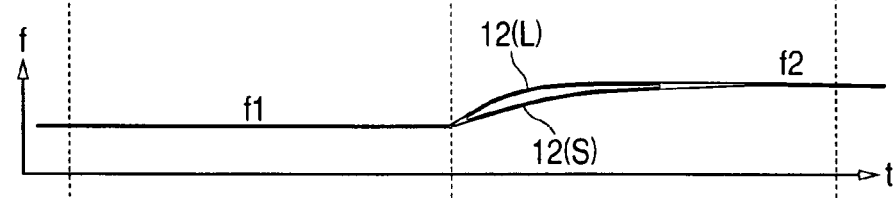
Figure 2C:
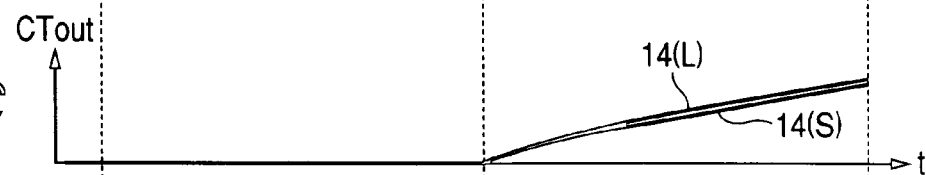
Figure 2D:
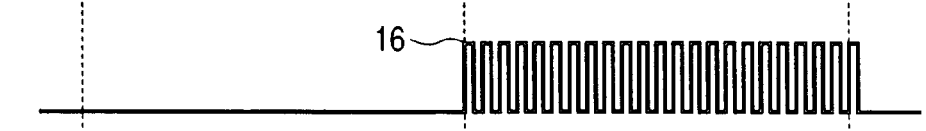
Figure 2E:
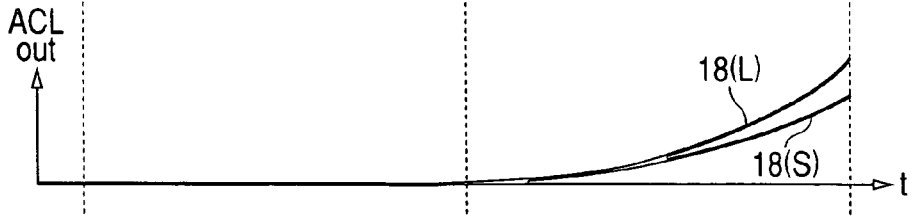

Referring to FIGS. 1 and 2, a first embodiment of the present invention is described. The embodiment is a circuit that detects the loop gain of a PLL circuit by applying a step input to the PLL circuit and integrates its response through a counter (CT) 6 and an accumulator (ACL) 7. The PLL circuit comprises a voltage controlled oscillator (VCO) 1, a variable Divider (DIV) 2, a phase detector (PD) 3, a charge pump circuit (CP) 4, and a loop filter (LF) 5. The PLL circuit performs operations as shown below.

After the VCO 1 output is divided by the variable divider 2 (hereinafter called a divider), the result is compared a reference clock (REFCLK) in the phase detector 3. A current of the pulse width determined by phase error is output from the charge pump circuit 4, integrated by the loop filter 5, and then fed back to a frequency control terminal of the VCO. The PLL circuit is converged to a state where an error at the phase detector 3 is minimized.

In this embodiment, the number of division N is first converged to the initial frequency f1 corresponding to the initial number of division N. Then, the number of division is changed to N+n, signals from the VCO are counted by a counter (CT) 6 while the PLL circuit changes to the frequency f2 corresponding to the number of division N+n, the count results are accumulate at a reference clock period by the accumulator 7. After being accumulated a predetermined number of times, the result is compared with the calculation data (Dcalc) of the accumulated value corresponding to a design value previously calculated and stored in a data register (REG) 9 in a comparison operation circuit block (CMP) 8, whereby a change in the loop characteristics is detected.

In FIG. 2, the horizontal axis indicates time, T1 is initial conversion period of time and T2 count period of time, and the vertical axis indicates the number of division N of the divider 2 in (a), the frequency f in (b), counter output CTout in (c), and accumulator output ACLout in (e) respectively. The (d) in FIG. 2 indicates an accumulator trigger signal based on the reference clock.

Before discussing the details of the embodiment, the transfer function of the PLL circuit is described for clarity. Assuming that phase of the VCO is θ, number of division of the divider N, charge pump drive current Icp, transfer function of the loop filter F(s), voltage control sensitivity Kv, and phase of the reference clock $\theta_0$, the transfer function with the phase $\theta_0$ as an input and the phase of the VCO as an output is given by well-known expression (1):

$$\theta = \frac{\frac{KvIcp}{s}H(s)}{\frac{KvIcp}{Ns}H(s)-1}\theta_0 \qquad (1)$$

In this embodiment, a step signal is input by varying the frequency divider ratio with respect to the PLL circuit. Therefore, a transfer function for the frequency divider ratio is derived. Assuming that VCO oscillating frequency is $f_{vco}$, frequency divider ratio before being given a step change is N, output signal frequency of the divider is $f_{Dnom}$, and frequency of the reference clock is $f_0$, a relationship shown by expression (2) holds:

$$f_{Dnom} = \frac{f_{vco}}{N} = f_0 \qquad (2)$$

Frequency $f_{div}$ at the divider output when the number of division is given time change n(t) is given by expression (3):

$$f_{div} = \frac{f_{VCO}}{N+n(t)} \cong \frac{f_{VCO}}{N}\left(1 - \frac{n(t)}{N}\right) \quad (3)$$

Assuming that frequency change at the divider output is $\Delta f_{div}$, we have expression (4):

$$\Delta f_{div} = f_{div} - f_{Dnom} = -\frac{f_{Dnom}}{N} n(t) \quad (4)$$

Phase change $\Delta \theta_{div}$ at the divider output is obtained by integrating frequency change $\Delta f_{div}$. Since the integration can be expressed by multiplying by 1/s in s domain and is given by expression (5):

$$\Delta \theta_{div} = \int \Delta f_{div} dt \Rightarrow -\frac{2\pi f_0}{N} \frac{n(s)}{s} \quad (5)$$

Transfer function for the number of division is given by the product of the last terms of expressions (1) and (5), then we have expression (6):

$$\theta = \frac{\frac{KvIcp}{s}H(s)}{\frac{KvIcp}{Ns}H(s) - 1} \frac{-2\pi f_0}{Ns} n \quad (6)$$

From the foregoing, it is possible to derive the transfer function for the number of division. Although this transfer function is one order higher than the transfer function for the reference clock phase, it is considered as a linear response as shown in expression (6). Regarding the VCO frequency, if the transfer function indicating a response of difference f for the number of division is determined assuming that the frequency corresponding to the number of division N is F and the frequency difference changing with n is f, then we have expression (7):

$$f = \frac{\frac{KvIcp}{s}H(s)}{\frac{KvIcp}{Ns}H(s) - 1} \frac{-2\pi f_0}{N} n \quad (7)$$

A lag-lead filter commonly used as a loop filter consists of a capacitance $C_1$, a $C_2$ connected in parallel to the $C_2$, and a serially connected resistance R. Transfer function H(s) for the lag-lead filter is given by expression (8). In this case, if expression (8) is substituted for expression (7), the order of the transfer function becomes third order.

$$H(s) = \frac{1 + C_2 Rs}{s(C_1 + C_2)\left(1 + \frac{C_1 C_2 R}{C_1 + C_2} s\right)} \quad (8)$$

Further, if an open loop transfer function G(s) is determined here, then we have expression (9):

$$G(s) = \frac{KvIcp}{C_0 Ns} \frac{1 + C_{2r} Rs}{s(C_{1r} + C_{2r})\left(1 + \frac{C_{1r} C_{2r} R}{C_{1r} + C_{2r}} s\right)} \quad (9)$$

where $C_{1r}$ and $C_{2r}$ represent capacitance ratio and $C_1 = C_0 C_{1r}$ and $C_2 = C_0 C_{2r}$ hold. If the PLL circuit is implemented by an integrated circuit, the capacitance ratio is kept constant and the absolute value $C_0$ varies with the ratio kept. An important thing in expression (9) is that if the capacitance ratio is kept constant, voltage control sensitivity Kv of the VCO oscillating frequency, charge pump drive current Icp, absolute value of capacitance $C_0$, and number of division N are all dependent on each other, and if any one of them varies the gain of the open loop transfer function will be affected, for example. Therefore, if these parameters are varied, optimizing the charge pump drive current Icp allows the transfer function to be kept constant with respect to any variation in these parameters. The resistance R in the loop filter does not affect the gain, but affects the pole and zero point values. Thus, the transfer function is independent of other parameters, and therefore individual adjustments are necessary to keep the transfer function constant.

Based on the foregoing, the details of this embodiment will be described. In this embodiment, after the PLL circuit is converged, the number of division of the divider is changed from N to N+n and the response is observed. This operation is described with reference to FIGS. 1 and 2. For the change of the number of division 11, first the number of division of the divider is set to N and the PLL circuit is converged during initial conversion period of time T1, as shown in (a) of FIG. 2. Then, the number of division is changed to N+n by a division setting switch circuit (SW) 10. Observing the frequency change 12 of the VCO 1, a response 12(L) when loop gain is large rises earlier than the response 12(S) when loop gain is small and then follows it, as shown in (b) of FIG. 2. Although the waveforms here are schematically drawn for easy understanding, actual waveforms will be complicated since the order the transfer function with the number of division as input and it frequency as output is third order, and overshoots and undershoots occur in the frequency response waveforms.

When the VCO oscillating signal are count during a certain period of time T2 immediately after the number of division is switched, count value 14 increases at an approximately constant slope for count value regardless whether it is 14 (L), the count value when loop gain is large, or 14 (S), the count value when loop gain is small, there is little difference in count values. This is because even if a step change giving about 2 to 3 MHz frequency difference is applied when the transmitter frequency band conforming to the GSM900 standard, a representative cellular phone standard, is 880-915 MHz, response differences are close to each other and do not increase. When the count result of the counter 6 was actually observed for every reference clock, there were cases where both responses were even reversed at some point due to the effect of an overshoot or undershoot.

Figure 3A:
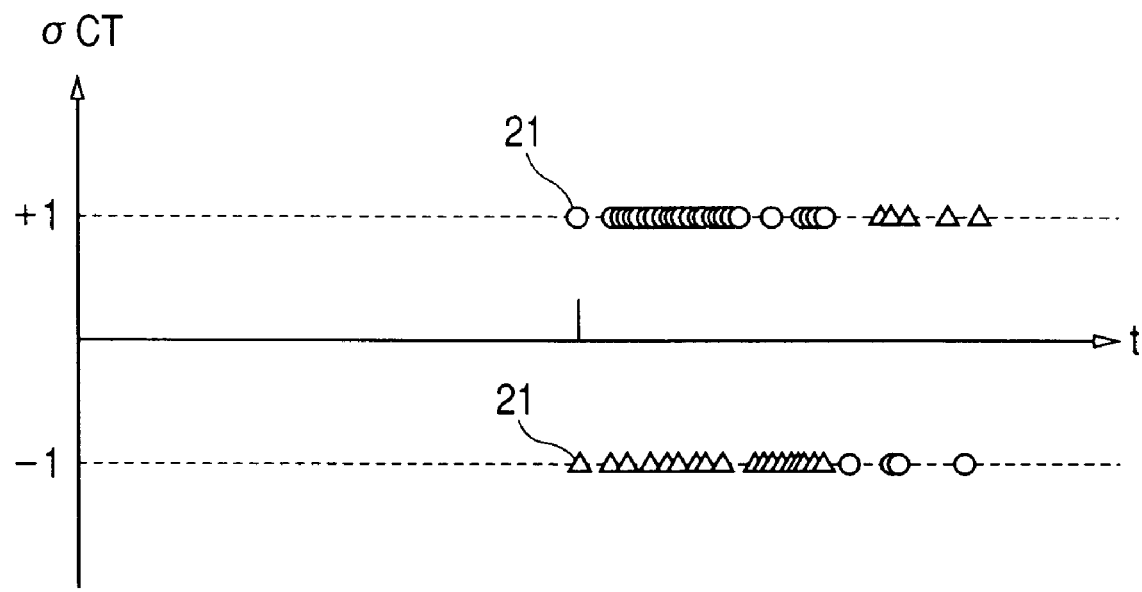
FIGS. 3A and 3B show the counter output deviation for different loop gains.

Therefore, when count results are recorded for every reference clock and the open loop gain is compared with an ideal response set to the design value, it was found that when open loop gain is lower than the design value the frequency of decrease of count result 22 increases, and when open loop gain is higher than the design value the frequency of increase of count result 21 increases, as shown schematically in (a) of FIG. 3.

Figure 3B:
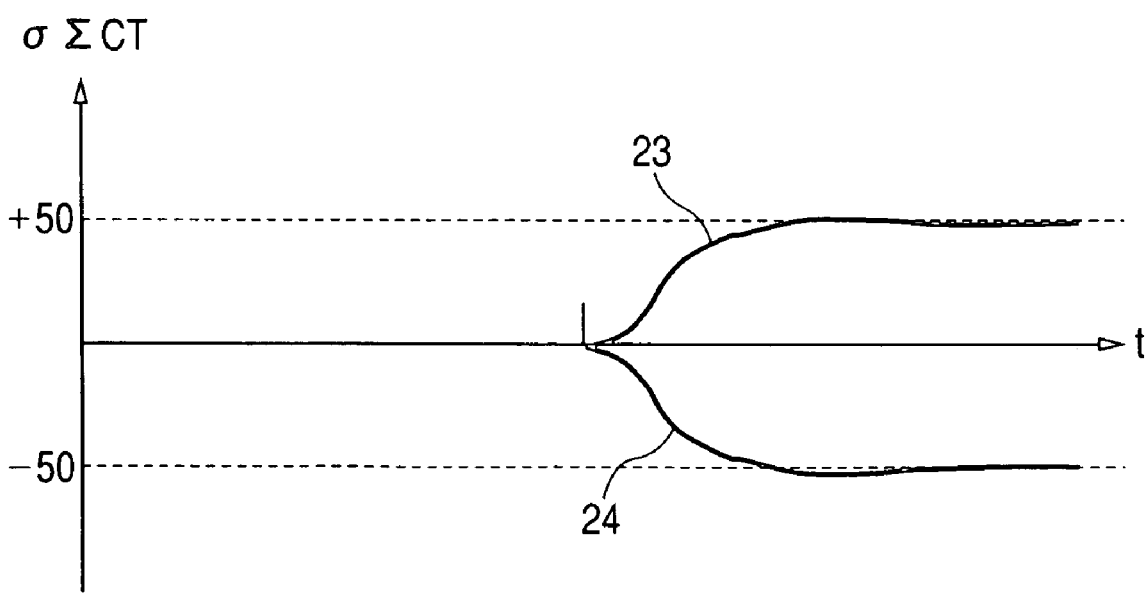

In order to detect this frequency, the accumulator (ACL) 7 was caused to generate a trigger signal 16 during count period of time T2 based on the reference clock as shown in (d) of FIG. 2, and the count results were accumulated. According to the accumulated value 18, obviously there was a difference in count value between when loop gain is large 18 (L) and when loop gain is small 18 (S). An output calculation value for each accumulation by the accumulator 7 was previously prepared for the design value of the loop filter 5, and a deviation σCT from the design value for count was shown in FIG. 3A and accumulation result and a deviation σΣCT from the design value for count is shown in FIG. 3B. As shown in FIG. 3B, a clear difference can be detected. Thus, changes in loop characteristics can be detected by accumulating the count result of the counter 6 by the accumulator.

As mentioned above, the result of the accumulator 7 is compared with the accumulated value data Dcalc that is the response from the PLL circuit operating according to the design value, which has been calculated and stored in the register 9. According to the difference the charge pump 4 current is switched, which allows the calibration of loop gain variations.

That is, in this embodiment, by forming a loop gain detection circuit comprising the accumulator 7, a comparison operation circuit block 8, and a data register 9 it is possible to detect loop gain variations and calibrate easily. Although this embodiment shows the case of controlling the amount of charge pump drive current, which is most easy to control currently, it is also possible to calibrate by changing the voltage control sensitivity of the VCO oscillating frequency or capacitance value. Furthermore, the relationship between initial frequency f1 and frequency f2, a frequency corresponding to f1 when the number of division is changed to N+n, is described to be f1<f2 here, but this magnitude relation may be reversed because the magnitude relation is not a bottom line of the embodiment.

Now, a second embodiment of the present invention will be described with reference to FIGS. 4 to 7. This embodiment is a case where the first embodiment is applied to a ΣΔ transmit circuit. The sigma delta transmit circuit 65 shown in FIG. 4 allows not only setting a frequency (number of division) for the PLL circuit of the first embodiment, but also, for example, overlapping a GMSK (Gaussian filtered Minimum Shift Keying) modulation signal on frequency setting term to oscillate at the desired center frequency of the VCO 1 and modulate, and extracting an RF modulation signal directly from VCO output.

Figure 4:
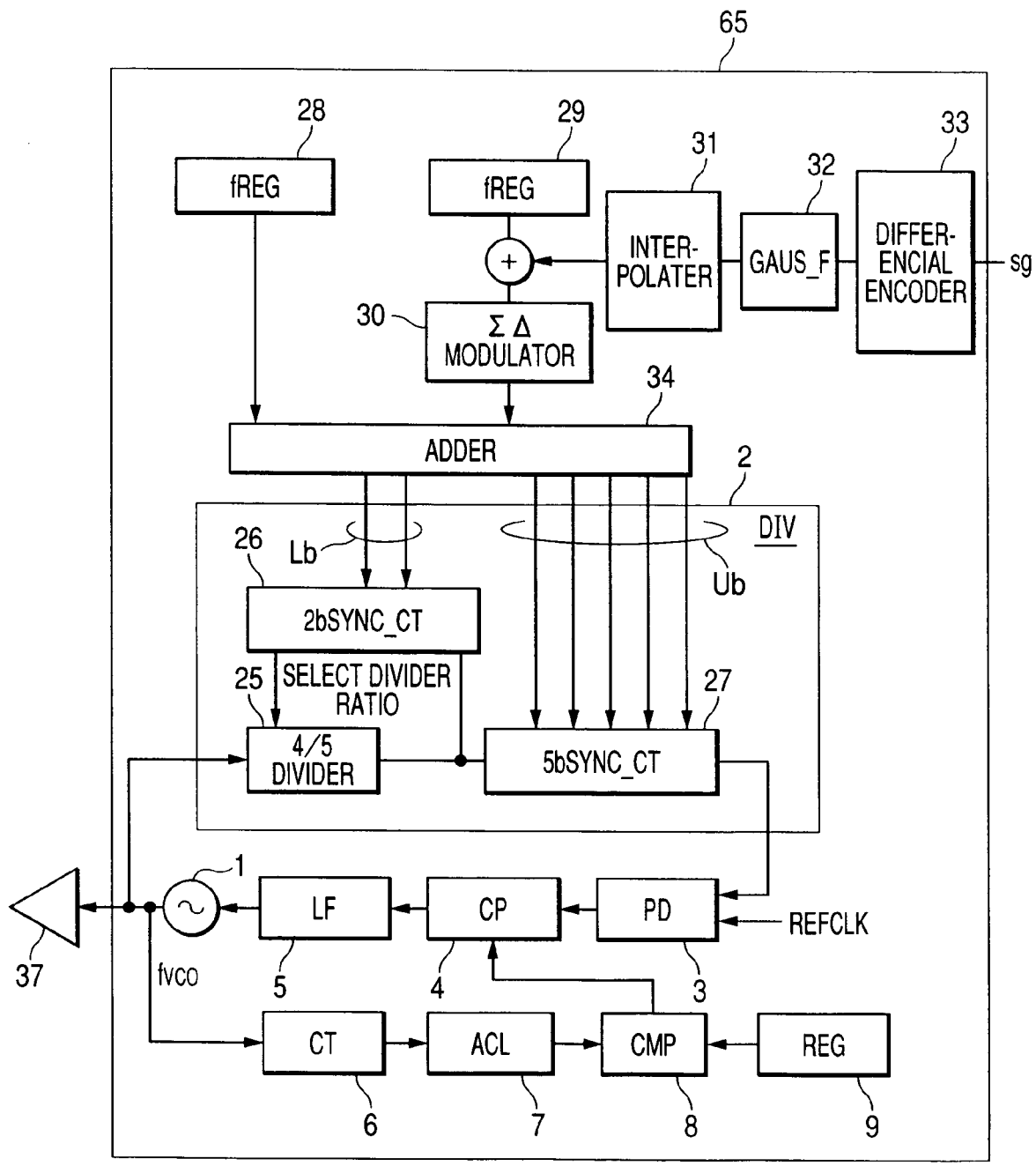
FIG. 4 shows a second embodiment of the present invention.

In FIG. 4, an original transmit signal sg represented by binary one bit is converted to a signed two bit data through a differential encoder 33, and this signed data string is filtered by a Gaussian filter 32 to generate a GMSK signal. The GMSK signal is interpolated by a interpolator 31 so as to become a data rate of the reference clock, for example 26 MHz, added to the setting value of the frequency register (fREG) having the setting accuracy of application's channel interval, for example 200 kHz in the case of the European cellular telephone GSM, and then applied to the sigma delta modulator 30. The sigma delta modulator has a function of converting a frequency setting value with a high degree of accuracy (channel interval frequency setting and a GMSK modulation signal) into a data string with a low degree of accuracy.

This sigma delta modulator output and the value of the frequency setting register (fREG) 28 with an accuracy n-times that of the reference clock are added by an adder 34, the upper five bits Ub are updated at the reference clock cycle as the setting value of a 5-bit synchronous counter (5bSYNC_CT) 27 in the divider (DIV) 2, the lower two bits Lb are updated at the reference clock cycle as the setting value of a 2-bit synchronous counter (2bSYNC_CT) 26 that drives the division number setting terminal of a ⅘ divider in the divider 2. This enables an average number of division of entire divider 2 to be set with a high degree of accuracy.

The components of other PLLs, i.e., VCO 1, phase detector 3, charge pump 4, and loop filter 5, as well as accumulator 7, comparison operation circuit block 8, register 9, etc. are all the same as in the first embodiment. Only adding a logical circuit to the PLL circuit in this configuration makes it possible to modulate a GMSK signal directly to the VCO and thereby to implement a small sized transmit circuit with low power consumption. Implementation of the sigma delta transmit circuit will require stabilization of loop characteristics, since the frequency characteristics of the PLL circuit shown in expression (7) described above influence a modulation signal.

Figure 5:
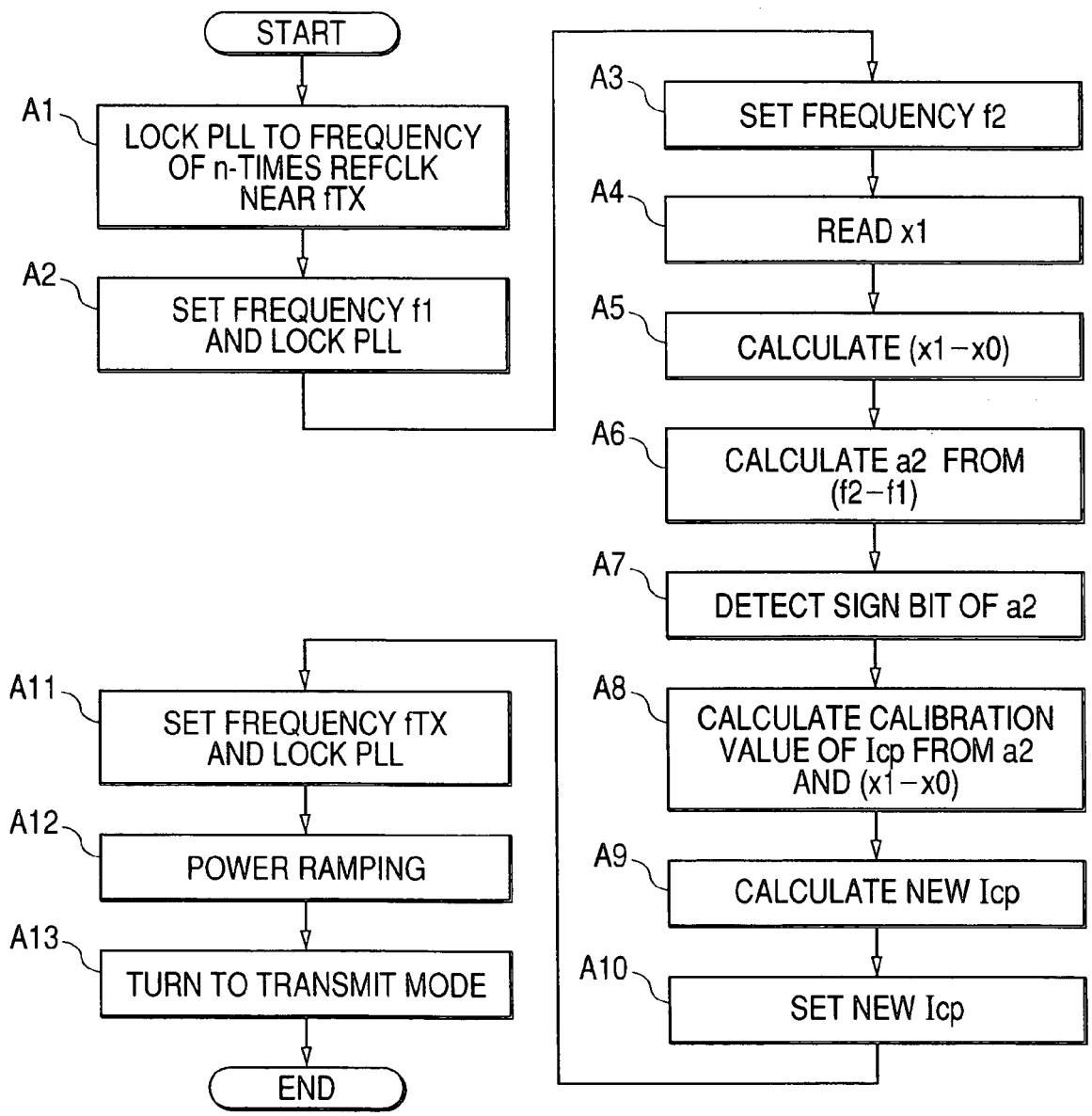
FIG. 5 shows the operation sequence of the second embodiment of the present invention.

The loop gain calibration operation in the sigma delta transmit circuit in such a configuration will be described, with reference to the operation sequence shown in FIG. 5 and the operation timing in FIG. 6. Note that the GMSK signal should be suspended during the calibration operation described below so that the GMSK signal is not input to the sigma delta modulator circuit.

First, the PLL circuit is locked to the channel of frequency fc that is n-times the reference clock REFCLK and near the desired frequency (in this case, a transmitter frequency fTX) (step A1). Since many of the frequencies of each channel are not n-times the reference clock frequency, there may be more than one relations between the reference clock phase and VCO 1 phase. To eliminate the error due to this phase difference, the PLL circuit is first locked to an n-times frequency to match the initial phases. Then, the frequency is set to the initial frequency f1 and the PLL circuit is locked (step A2).

After the PLL circuit is converged, the frequency f2 to be stepped is set (step A3). The counter 6 and accumulator 7 are operated while locking the PLL circuit to frequency f2, and after a predetermined period of time, the accumulator output i.e., accumulated counter value is read (step A4). The read value x1 and the standard value x0 of the accumulator count value for loop characteristics and other design values are compared (step A5)

The difference between frequencies f1 and f2 is usually specified at constant value, but may be varied according to the setting channel. In such a case, since the difference from the standard value is varied with respect to the variation in the same loop gain, a calibration coefficient a2 is determined from the product of a frequency difference dependency efficient a1 and the set frequency difference (f2−f1) (step A6). In this embodiment, as in the first embodiment, magnitude relation between f1 and f2 will not affect the operation. However, since the calibration coefficient is affected by the sign, the sign is detected from the magnitude relation (step A7)

Calibration of the calibrated charge pump current Icp is calculated by multiplying the coefficient a2 thus determined by the difference (x1−x0) from the standard value (step A8). After the new charge pump current Icp is calculated to perform a scaling corresponding to the setting of current value (step A9), charge pump current is set (step A10).

Since this completes the calibration of loop characteristics, the desired transmitter frequency fTX is set and the PLL circuit is locked (step A11). Then, a power amplifier 37 is powered on (step A12), and transmission is started (step A13).

Figure 6:
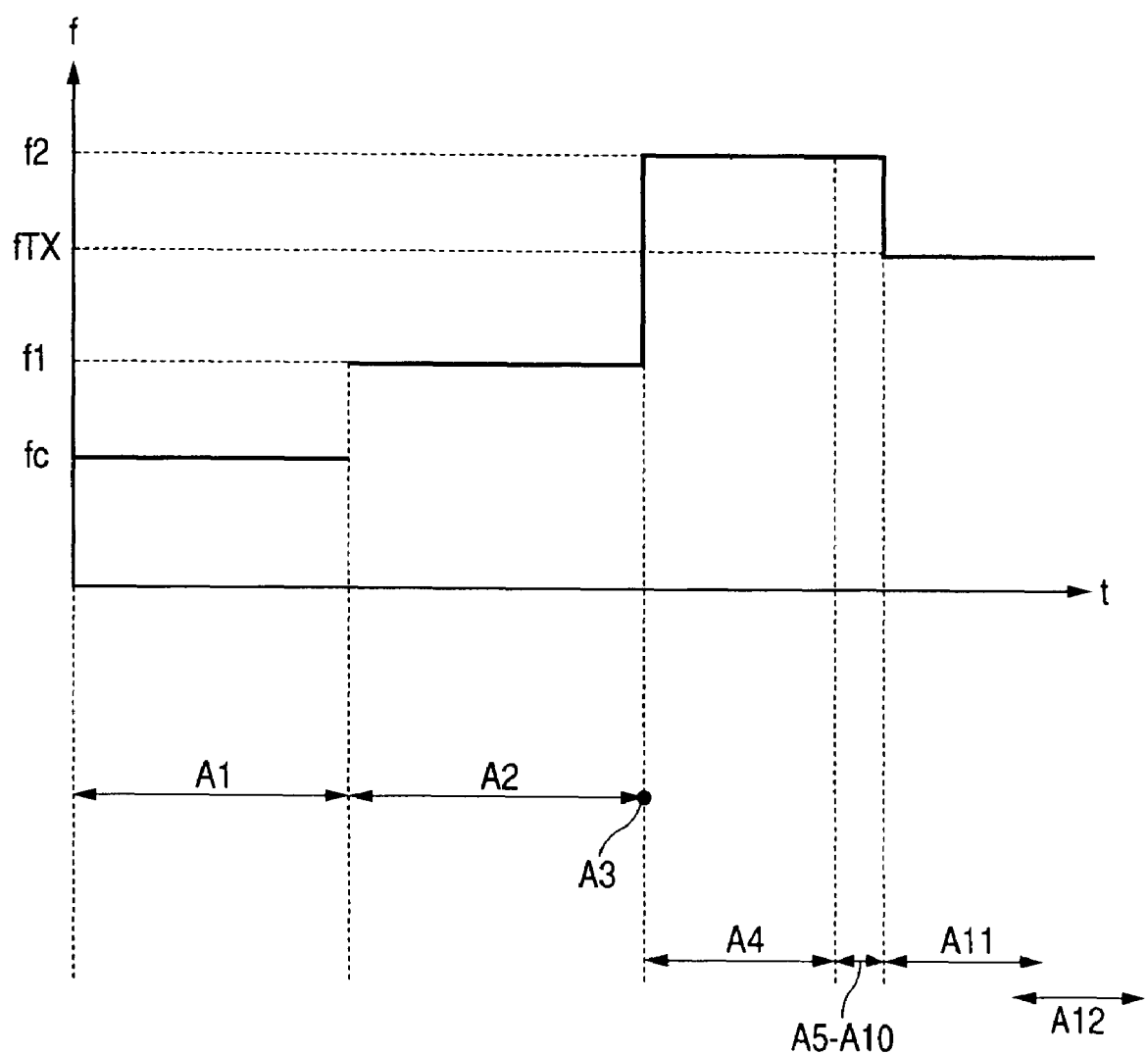
FIG. 6 shows the operation timing of the second embodiment of the present invention.

FIG. 6 shows the operation timing and the step numbers A1 to A12 used in the corresponding operation flowchart are also shown here.

Figure 7:
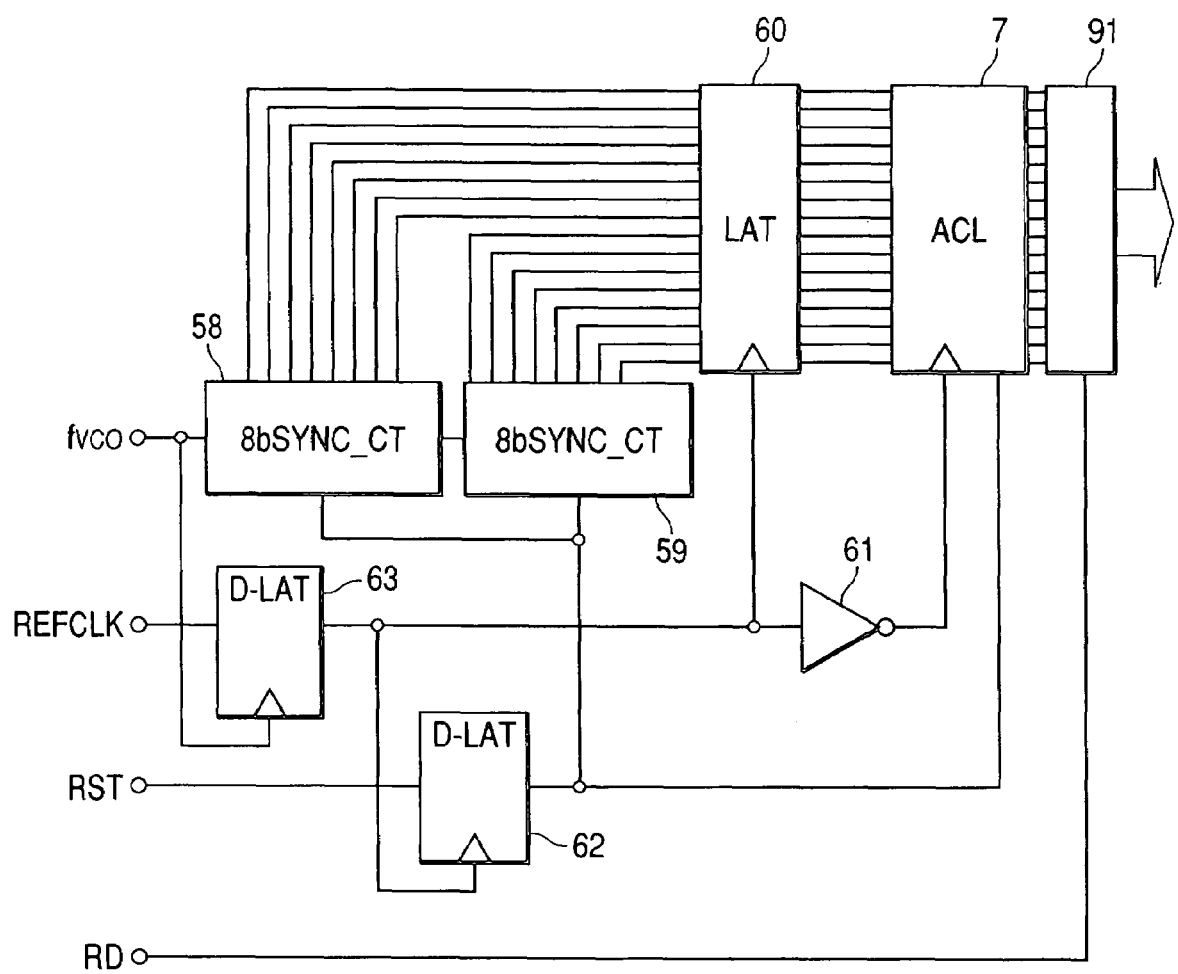
FIG. 7 shows the configuration of a counter and accumulator used in the second embodiment of the present invention.

Now, the detailed configuration of the counter circuit 6 and accumulator circuit 7 will be described with reference to FIG. 7. The counter circuit is composed of an 8-bit synchronous counter (8bSYNC_CT) 58 that is driven by the VCO signal fVCO and an 8-bit synchronous counter (8bSYNC_CT) 59 that is driven by the output of counter 58. The count process is taken into a latch (LAT) 60 at the reference clock REFCLK cycle, and into the accumulator (ACL) at a clock cycle reversed by an inverter 61. To prevent the collision of the take-in timing of latch 60 and the count timing of VCO, the timings are adjusted by striking a D latch circuit (D-LAT) with a VCO signal according to a reference clock. Counting is started by turning off a reset signal (RST), and here again the timings are adjusted by re-striking the D latch circuit 62 with the VCO signal according to the reference clock to prevent collision with the reference clock or VCO signal.

A data read signal (RD), for example, activates the latch circuit 91 at its high level and outputs the accumulator 7 output to the comparison operation circuit block 8.

This embodiment allows for implementation of the sigma delta circuit whereby loop band is calibrated and the effect of loop characteristics variation on demodulation characteristics such as phase accuracy is reduced.

Figure 8:
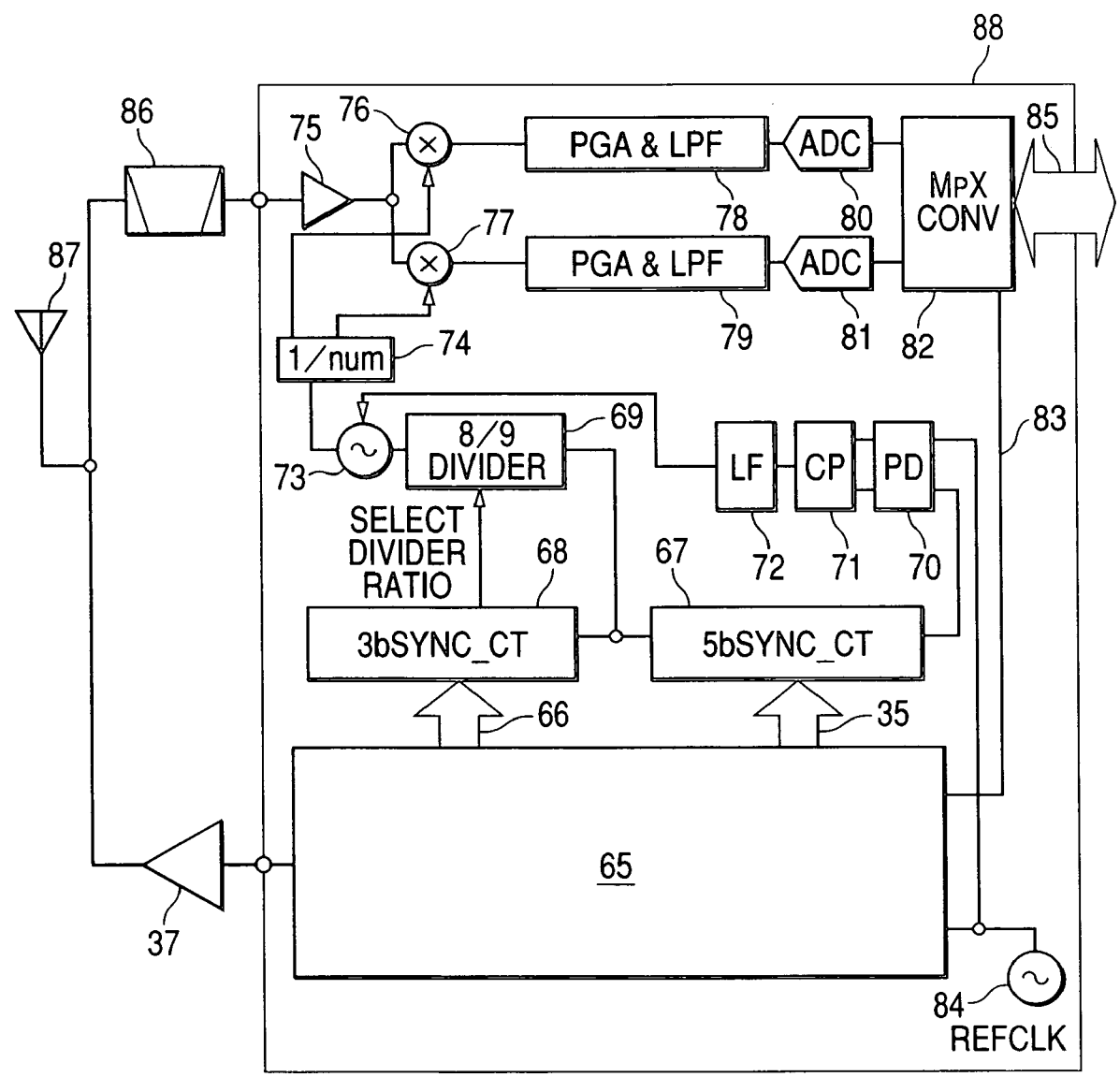
FIG. 8 shows a third embodiment of the present invention.

A third embodiment of the present invention will be described with reference to FIG. 8. This embodiment is a PLL circuit wherein the sigma delta transmitter circuit 65 of the second embodiment is contained in the transceiver IC.

First, the configuration of a receiving system is described. A signal received through an antenna 87 is amplified by a low noise amplifier 75 through a band pass filter 86. The band pass filter 86 reduces the out-of-band interference wave level, and is used to prevent the saturation of the low noise amplifier 75. A mixer 76 and a mixer 77 perform the orthogonal demodulation to down-convert a signal to a baseband signal Low frequency variable amplifier & low pass filter (PGA & LPF) banks 78 and 79 amplify the signal and suppress out-of-band noises. This relaxes the bit accuracy of an analog digital converters (ADC) 80 and 81. The 82 is a digital interface circuit to exchange digital signals both ways and also a multiplex converter (MPXCONV). This device exchanges transmit binary signals 83 from the sigma delta transmitter circuit 65 and external digital signals via a bidirectional bus 85.

In orthogonal demodulation, the mixer 76 and mixer 77 must input signals that are out of phase by 90 degrees. A voltage controlled oscillator 73 oscillates at a frequency twice or four times the received frequency, and divides the output to achieve the exactly 90 degree phase difference.

The output of the voltage controlled oscillator 73 is divided by a prescaler 69, a 3 bit synchronous counter (3bSYNC_CT) 68, and a 5 bit synchronous counter 67. At this time, the division number control of the divider (1/num) 74 can perform fractional division by using the control by the sigma delta modulator. For the sigma delta modulator, it is possible to use that used in the transmission system when GSM-compatible transmission and reception is performed using timesharing method.

Regarding the control method, a programmable counter may be employed for the 3 bit synchronous counter 68 and 5 bit synchronous counter 67, and count value may be controlled by the control signals 66 and 35. The reference clock source 84 oscillates as 26 MHz. Since the 26 MHz reference clock 84 is used for the 4 GHz voltage controlled oscillator 73, number of division is around 150. Therefore, 8 bits are required for division number control, and a 3 bit counter is needed to make the prescaler 69 8/9 division. The output of the reference clock 26 and the output of the 5 bit synchronous counter 67 are compared in phase by the phase detector 70. The phase detector 70 forms voltage waveform only for the phase difference, and the charge pump 71 flow a current only during the voltage waveform. This charge pump current is averaged and converted to voltage by charging and discharging the capacitance of the loop filter 71. The voltage controlled oscillator 73 is controlled by this voltage.

Figure 9:
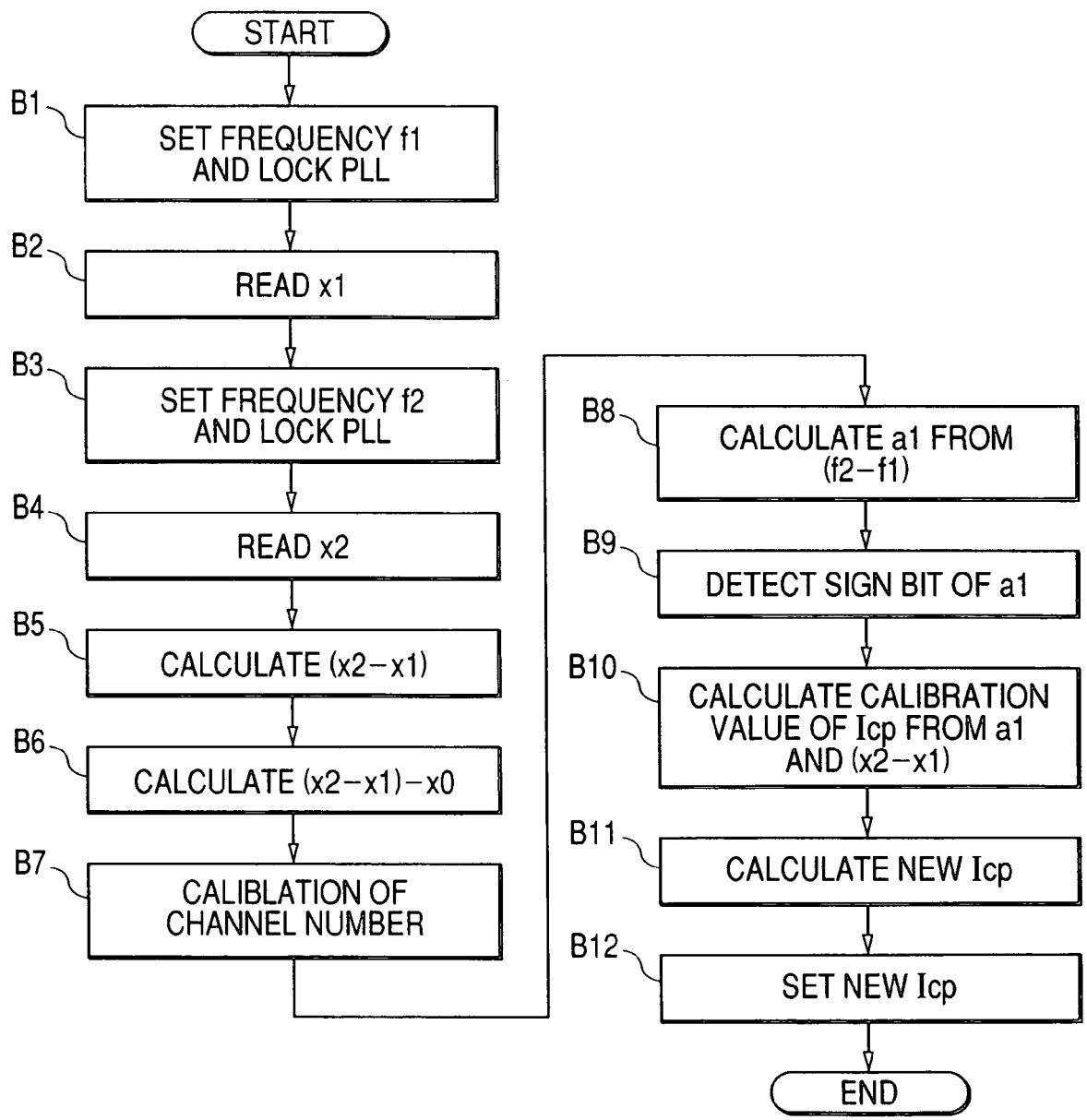
FIG. 9 shows the operation sequence of the fourth embodiment of the present invention.

Thus, the transceiver IC can be implemented by utilizing the transmitter circuit 65 of the second embodiment, and particularly sharing the sigma delta circuit block with a local oscillating signal synthesizer of the receiver FIG. 9 shows the control method in the fourth embodiment. The configuration is this embodiment is the same as that of the third embodiment shown in FIG. 4. Also, the counter operation is the same as that shown in the third embodiment.

The operation of this embodiment is described according to the operation sequence shown in FIG. 9. In this embodiment, measurement by the counter is performed twice at different frequencies.

For the first measurement, frequency is set to the first frequency f1 by the divider 25, and after conversion time for stabilizing the system is over, the counter 6 is operated to start the first measurement (step B1).

After specified measurement time has passed, the operation of the counter 6 is stopped and the counter value x1 is read (step B2). When the measurement start time difference Δt has passed from the first measurement start time, frequency is set to second frequency f2 by the divider 25 and simultaneously the counter 6 is operated to start the second measurement (step B3).

After specified measurement time has passed from the start of the second measurement, operation of the counter is stopped and the counter value x2 is read (step B4).

In this embodiment, the first and second measurement time is to be the same, different values may be used. After the second measurement is finished, frequency is set to the frequency fTX of the desired channel.

Figure 10:
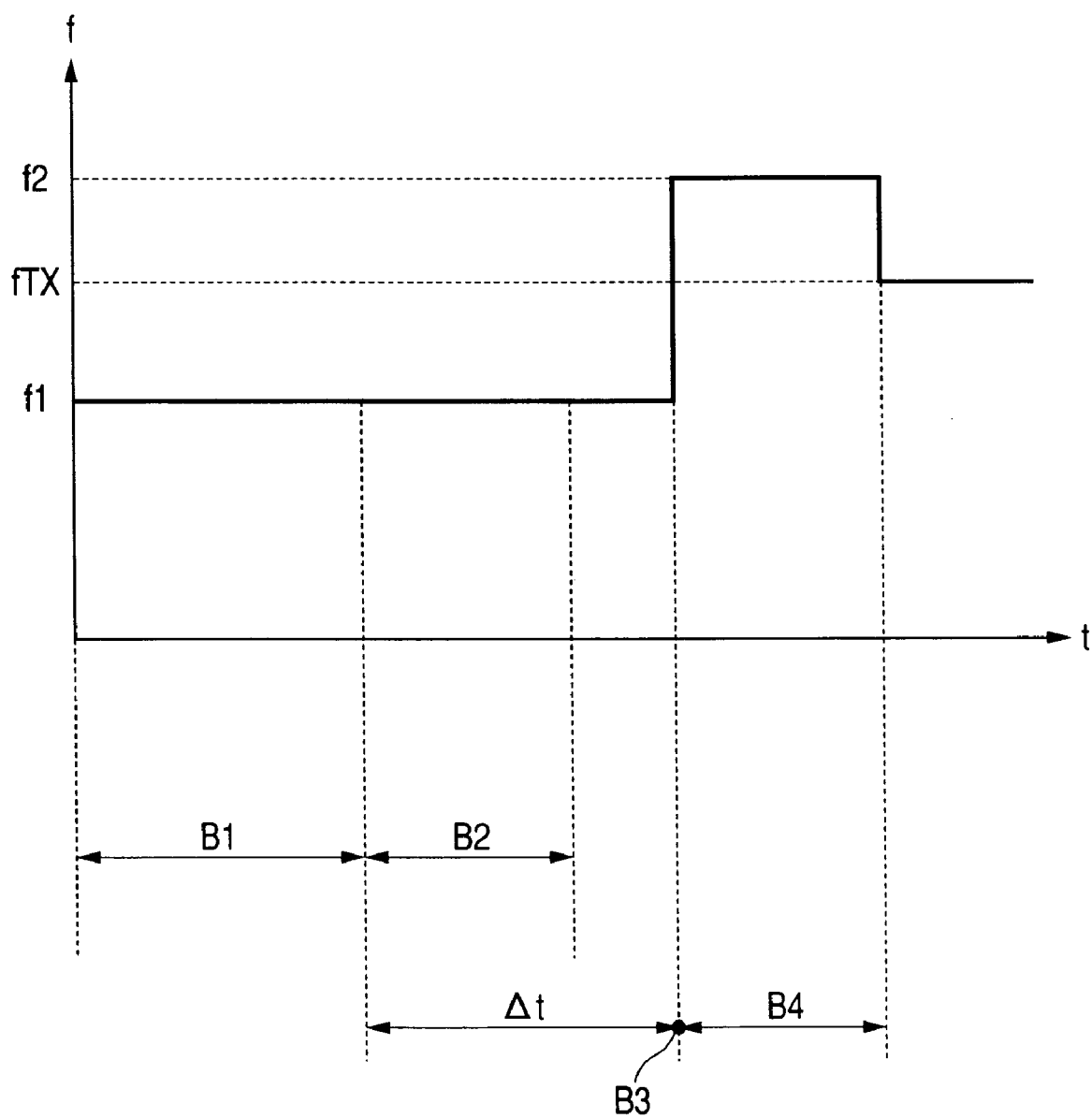
FIG. 10 shows the operation timing of the fourth embodiment of the present invention.

In the operation timing chart of FIG. 10, the first frequency f2 is higher than the first frequency f1, but a similar measurement can be made with f1 being higher than f2. Although charge pump current Icp during the measurement may be a value close to the desired charge pump current, it is also possible to make this current value larger than the desired value and thereby to cause the difference between the first and second measurements to appear more prominently.

For the measurement star time difference Δt, measurement accuracy can be increased by selecting the time so that the phase difference of the VCO 1 becomes the same both at the first measurement start time and second measurement start time. For example, when the VCO frequency is n-times 200 kHz for all the channels and the operation clock of the counter is 26 MHz, their ratio is 130 and consequently phase of the VCO becomes the same at every 130 cycles of the 26 MHz clock, or every 5 microseconds. Therefore, by making the measurement start time difference n-times 5 microseconds, the initial phase of the VCO becomes the same for the first and second measurements.

Now, method of calibrating the charge pump current Icp to be performed at step B5 and after in FIG. 9 is described. First, the counter value x1 for the first measurement and the counter value x2 for the second measurement are read, and the difference (x2−x1) between them is calculated (step B5). The reference value x0 is subtracted from the difference (step B6), and calibration of channel number is made (step B7).

A simple primary calibration sufficiently serves the purpose of calibration of channel number, but higher level calibrations such as secondary and thirdly calibrations may be performed. When demand for the accuracy is low, the calibration of channel number may be skipped.

Calibration value for the charge pump current Icp is calculated by multiplying this calibrated value by a coefficient a1, and this coefficient a1 is determined by the difference (f2−f1) between the first frequency f1 and second frequency f2 (step B8). And, the sign bit of the coefficient a1 is detected by the direction in which the frequency changes (step B9). Then, the calibration amount of the charge pump current is calculated from the coefficient a1 and counter difference value (x2−x1) (step B10). Here, a primary calibration using only one coefficient or a higher calibration using multiple coefficients may be performed. By adding the calibration value obtained by this calculation to the charge pump current value, it is possible to obtain the desired charge pump current Icp (step B12).

Figure 11:
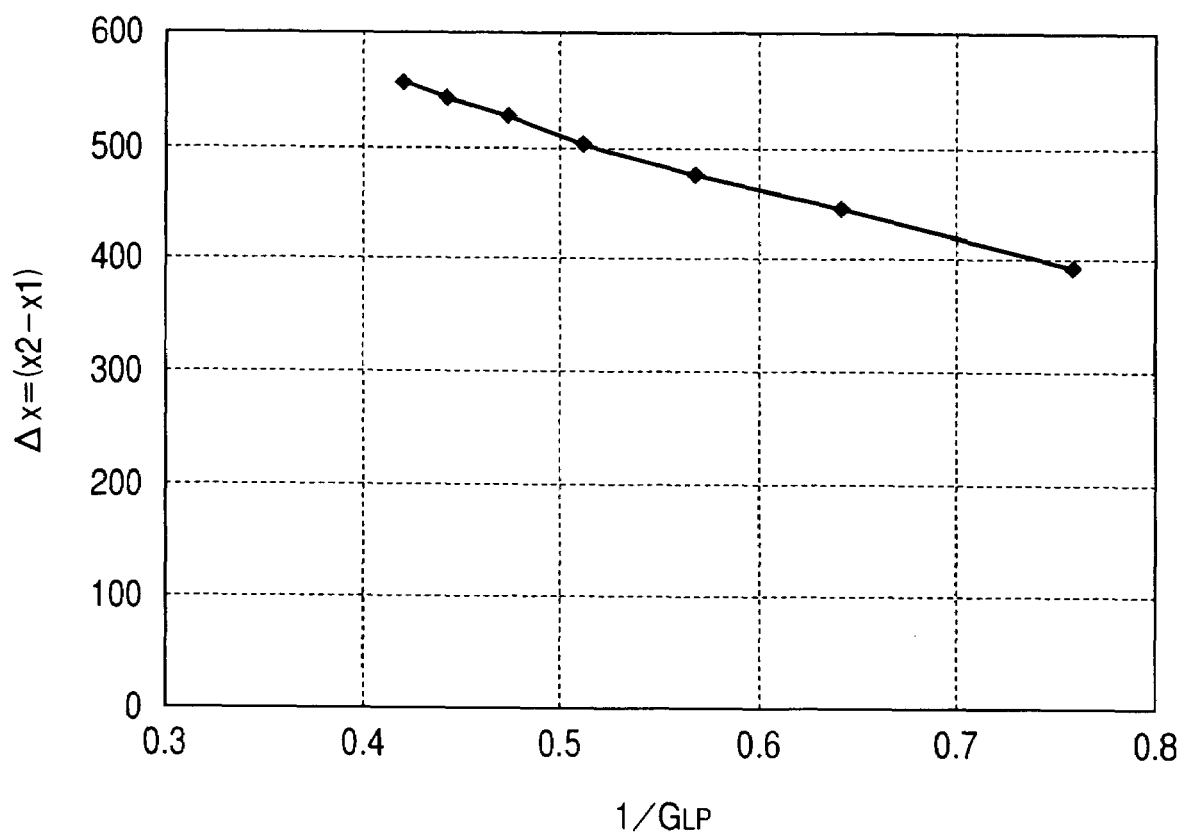
FIG. 11 shows a simulation result of the fourth embodiment of the present invention.
Figure 12:
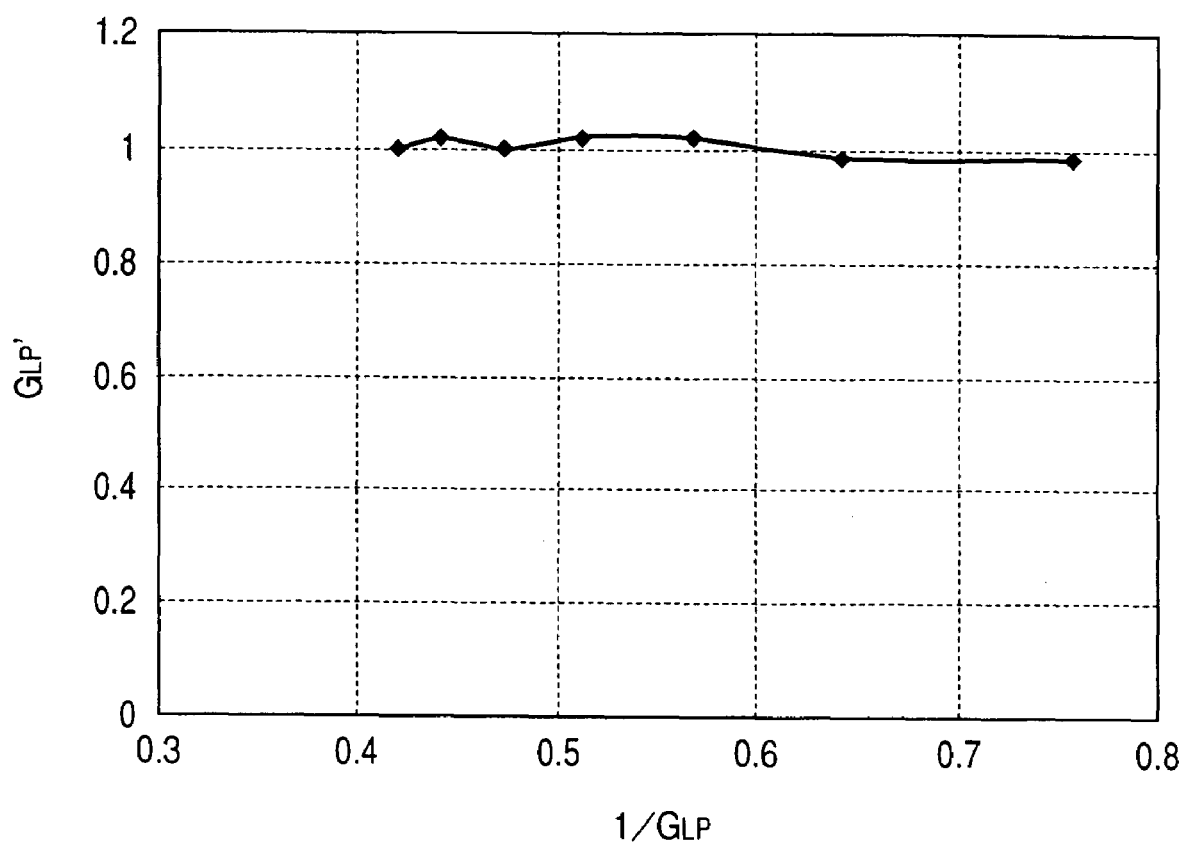
FIG. 12 shows a simulation result of the fourth embodiment of the present invention.

FIGS. 11 and 12 show the simulation results of this embodiment. FIG. 11 shows the counter value when loop gain $G_{LP}$ is varied. The horizontal axis indicates the inverse number of loop gain $1/G_{LP}$, and the vertical axis indicates the difference Δx between the counter value x1 at the first measurement and the counter value x2 at the second measurement. The graph in FIG. 11 is approximately linear and therefore a primary calibration is possible. FIG. 12 shows the result of a primary calibration. The horizontal axis indicates the inverse number of loop gain before calibration $1/G_{LP}$, and the vertical axis indicates the loop gain $G_{LP}$ after calibration. The loop gain has been made approximately constant, which proves the effectiveness of the present invention.

Figure 13:
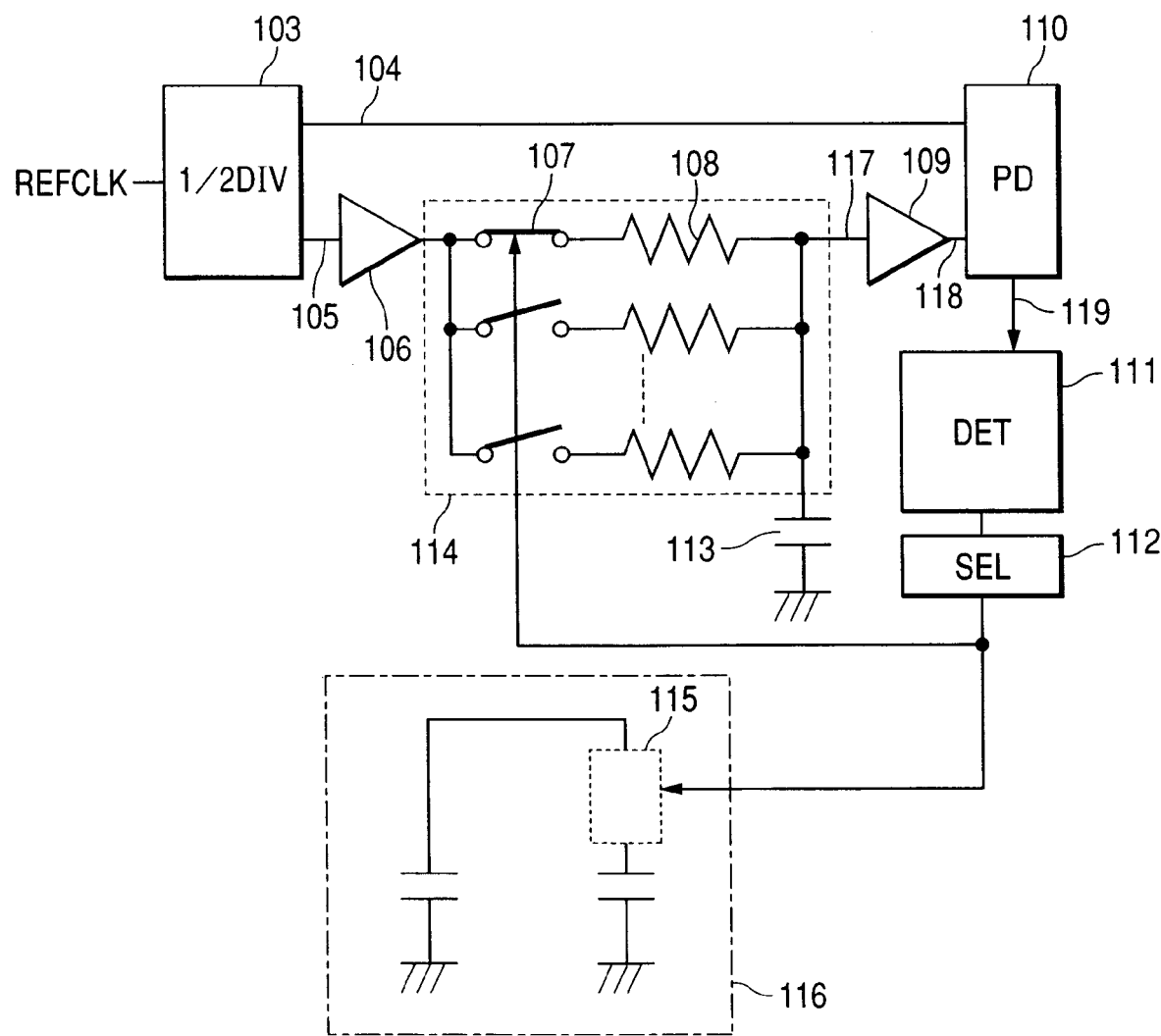
FIG. 13 shows a circuit to calibrate the resistance variation in a fifth embodiment of the present invention.
Figure 14:
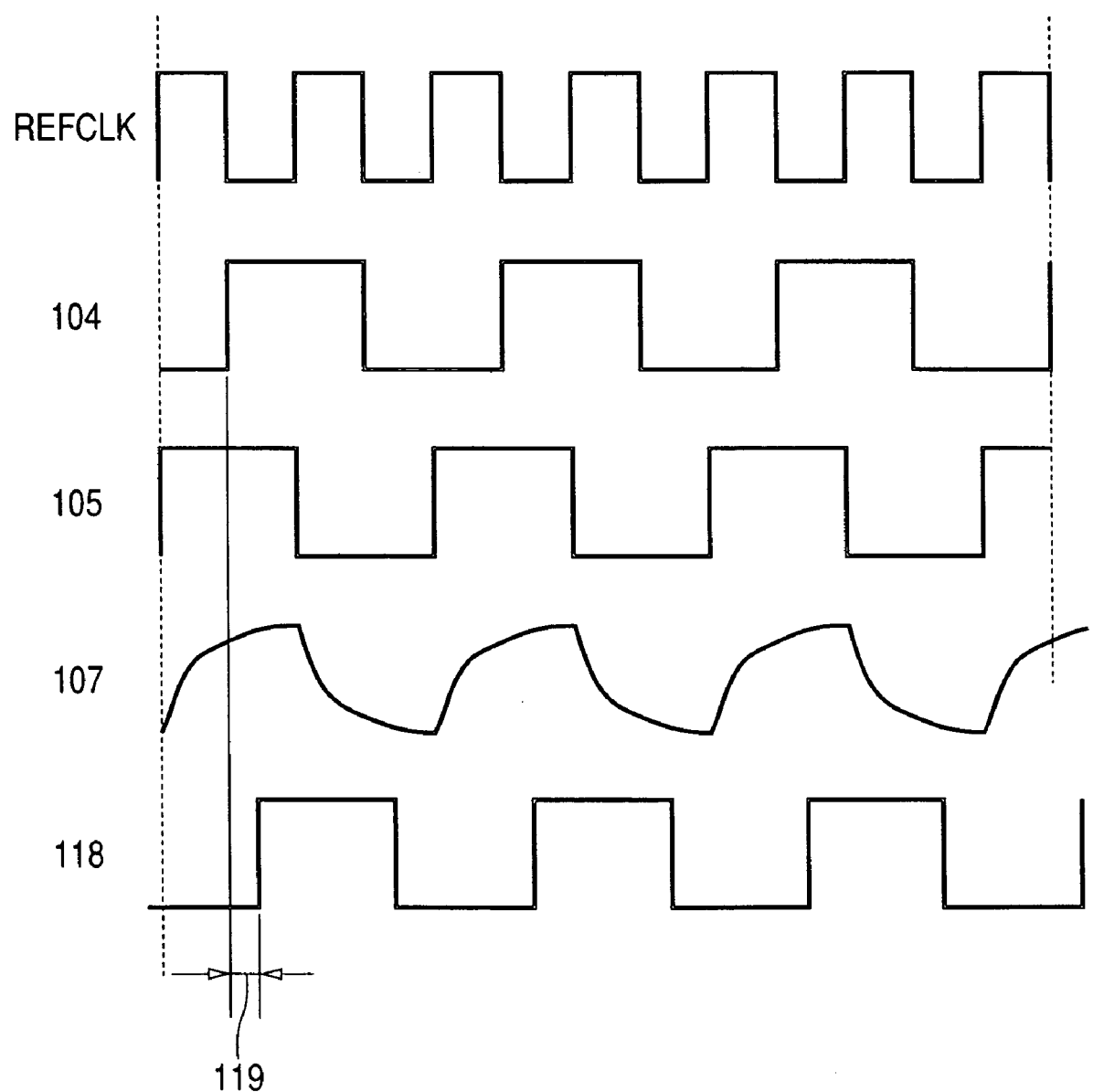
FIG. 14 shows the signal timing of the fifth embodiment of the present invention.

FIG. 13 shows a block diagram of the time constant adjustment circuit in the loop filter of the fifth embodiment of the present invention. As an example of operating waveforms for explaining the operation of the circuit shown in FIG. 13, reference clock REFCLK, division outputs 104 and 105, primary RC integral filter output 117, limiter amplifier output 118, and phase detector output 119 are shown in FIG. 14.

First, the input reference clock is divided by a ½ divider (½ DIV) 103 as shown in FIG. 13. The ½ divider 103 have tow functions: a function of dividing at a trailing edge of the input and that of dividing at a leading edge (refer to FIG. 14). Divided output 104 is fed to a phase detector (PD) 110 and divided output 105 is fed to a buffer amplifier 106.

The divided output 105 is fed to, after the load drive capability is increased by the buffer amplifier 106, the primary RC integral filter comprising a resistor & switch array circuit 114 and capacitance 113. The resistor & switch array circuit 114 is composed of an integrated resistor 108 and its switch, and have a function of changing the impedance discretely by operating the switch 107 as needed.

The primary RC integral filter removes higher harmonic components from the output pulse of the buffer amplifier 106 based on the time constant determined by the capacitance value of the capacitance 113, and then drives the limiter amplifier 109. The limiter amplifier 109 has a function of outputting a ground potential for the input lower than a threshold, which is a midpoint potential between power supply voltage and ground potential, and outputting a power supply potential for the input higher than the threshold. Accordingly, output signal 118 of the limiter amplifier 109 can change the amount of delay according to the impedance of the resistor & switch array circuit 114 relative to the division output 104.

Next, the division output 104 and the output signal of the limiter amplifier 109 are phase-detected by a phase detector 110. The phase detector 110 outputs a signal 119 with polarity depending on lead or lag of the phase, based on the edge information on the two input signals. When the edges of the two input signals are exactly synchronous, the output of the phase detector 110 becomes zero. Based on this, an optimum value identifier block 111 selects the switch 107 of the resistor & switch array circuit 114 through a selector (SEL) 112 such that the output of the phase detector 110 becomes zero.

For example, by sweeping the switch signal of the switch 107 such that the impedance of the resistor & switch array circuit 114 changes from low impedance to high impedance, and selecting the state of the switch where the output of the phase detector 110 is closest to zero, the optimum value is determined. As a result, it is possible to calibrate the variation of the time constant of the primary RC integral filter that is caused by the production variation of resistor and capacitance on the integrated circuit process.

Finally, the output signal of the optimum value identifier block (DET) 112 is also fed to the resistor & switch array circuit 115 contained in the loop filter 116 through the selector 112. The relative deviation between resistors and that between capacitances on the integrated circuit process are within a few percents respectively, and high degree of accuracy can be secured, thus allowing the time constant of the primary RC integral filter and that of the loop filter 116 to be calibrated simultaneously. In the embodiments 1 to 4, loop gain is calibrated but pole and zero point are not. However, by using the time constant adjuster circuit of the loop filter of this embodiment together with the embodiments 1 to 4, it is possible to calibrate any of the loop gain, pole, and zero point.

Figure 15:
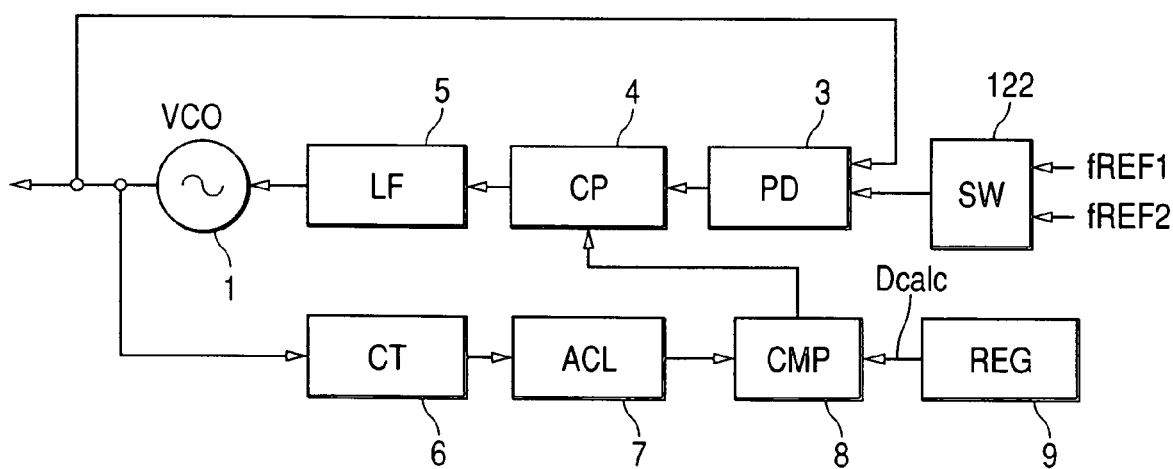
FIG. 15 shows a sixth embodiment of the present invention.

FIG. 15 shows the configuration of a sixth embodiment. In the first embodiment, measurement is made by changing the divider ratio, but measurement is done by changing the reference frequency in this embodiment. First, a switch (SW) 122 is set to the reference frequency fREF1 side, and after the PLL circuit is converged during the initial conversion period of time T1 shown in FIG. 2, the reference frequency is switched to fREF2. The value of the accumulator 7 changes from 18 (L) to 18 (S) according to loop gain, as shown in FIG. 2.

By reading the value of the accumulator 7, after the measurement time T2 has passed, comparing the value of the same with the calculated data Dcalc that has been previously set in the register 9, and switching the charge pump current according to the difference between them, it is possible to calibrate the loop gain.

This embodiment can be applied to the same calculation method as in the fourth embodiment. The calculation method at this time is as shown in FIG. 9. By setting the switch 122 to a first reference frequency fREF1 at step B1, and setting the switch 122 to a second reference frequency fREF2, two measurement values can be obtained. Performing the steps B5 to B11 to these two measurement values allows the obtaining of charge pump current. By setting this charge pump current in the same way as at step B12, it is possible to calibrate the loop gain.

The preferred embodiments have been described. The present invention allows the detection of loop characteristics with a high degree of accuracy, simply by adding a counter and an accumulator to the PLL circuit. Particularly, the present invention implements the calibration of loop characteristics of the sigma delta transmitter circuit which demands a high degree of loop characteristics accuracy, as well as highly accurate calibration of loop gain of a wide variety of PLL circuits.

It should be understood that the present invention is not limited to the above embodiments, and it is possible to change the design in various ways within the spirit and scope of the present invention.

What is claimed is:

1. A phase locked loop circuit comprising:
a first voltage controlled oscillator;
a first frequency transform circuit to which the output of said first voltage controlled oscillator is connected;
a first phase detector to a first input of which the output of said first frequency transform circuit is connected, and to a second input of which a first reference signal is connected;
a first charge pump circuit to which the output of said first phase detector is connected;
a first loop filter to which the output of said first charge pump circuit is connected, wherein the output of said first loop filter is connected to a frequency control terminal of said first voltage controlled oscillator;
a first counter circuit to which the output of said first voltage controlled oscillator is input;
a first accumulator circuit to which the output of said first counter circuit is input; and
a first loop characteristics detection circuit that detects the loop characteristics of the phase locked loop circuit based on the result obtained by integrating the output of said first counter circuit through said first accumulator circuit.

2. The phase locked loop circuit according to claim 1, wherein the integral result of the output of said first counter circuit is the integral result that is obtained by integrating the change process when the frequency transformation characteristics of said first frequency transformation circuit is changed stepwise from a first frequency to a second frequency, in said first counter circuit and a first accumulator circuit connected to the output of said first counter circuit.

3. The phase locked loop according to claim 1, wherein the integral result of the output of said first counter circuit is the integral result that is obtained by integrating the change process when said first reference signal is changed stepwise from a first frequency that is the first setting to a second frequency that is the second setting, in said first counter circuit and said first accumulator circuit connected to the output of said first counter circuit.

4. The phase locked loop circuit according to claim 2, wherein said first frequency transform circuit is a first divider,
wherein the number of division of said first divider is determined by adding the output of a first ΣΔ modulator and a first register output, and
wherein regarding the setting for changing the frequency stepwise from said first frequency to said second frequency, frequency transform characteristics is set at said first register and a second register connected to the input to said first ΣΔ modulator, and loop gain is maintained constant by changing the charge pump current of said charge pump circuit according to the loop characteristics detected based on said integral result.

5. The phase locked loop according to claim 3,
wherein said first frequency transform circuit is a first divider, and
wherein loop gain is maintained constant by changing the drive current for the charge pump current of said charge pump circuit according to the loop characteristics detected based on said integral result.

6. The phase locked loop circuit according to claim 5,
wherein said integral result is the integral result obtained by, after converging the phase locked ioop to a third frequency that is an integral multiple of said first reference signal, converging the phase locked loop to said first frequency, then setting to said second frequency, and integrating the process of converging to said second frequency in said first counter circuit and a first accumulator circuit connected to the output of said first counter circuit, and
wherein loop gain is maintained constant by changing the drive current for the charge pump current according to the characteristics detected based on said integral result.

7. The phase locked loop circuit according to claim 3,
wherein loop gain characteristics are maintained constant by converging the phase locked loop to said first frequency; specifying as first data the integral result obtained by integrating the output of the voltage controlled oscillator for a predetermine period of time in said first accumulator circuit that is connected to said first counter circuit and the output thereof; then setting to a second frequency; specifying as second data the integral result obtained by integrating the process of converging to said second frequency in a first accumulator circuit that is connected to said first counter circuit and the output thereof; detecting loop characteristics based on the difference between said first data and said second data; and changing the drive current for said charge pump current according to the detected loop characteristics.

8. The phase locked loop circuit according to claim 4, further comprising:
a first phase shifter having a first resistor array and a first capacitance, which can be switched between them by a switch, and to which a first clock signal is input; and
a first control block that compares the output of said first phase shifter a n d a second clock which is 90 degrees out of phase from said first clock and switch said resistor array so that both phases matches,
wherein resistors composing said loop filter comprises a second resistor array having the same configuration as said resistor array and also having the same ratio of resistance, and
wherein the same control as for said first resistor array is provided to said second resistor array.

9. A loop characteristics detector circuit, comprising:
a first voltage controlled oscillator;
a first frequency transform circuit;
a first phase detector to a first input of which the output of said first frequency transform circuit is connected and to a second input of which a first reference signal is connected;

a first charge pump circuit to which the output of said first phase detector is connected;

a first loop filter to which the output of said first phase detector, the output of said first loop filter being connected to the frequency control terminal of said first voltage controlled oscillator;

a first counter circuit to which the output of said first voltage controlled oscillator; and a first accumulator circuit to which the output of said first counter circuit is connected, wherein said loop characteristics is detected based on the integral result of said first counter circuit output that was integrated in said accumulator circuit.

10. A phase locked loop circuit comprising:

a first voltage controlled oscillator;

a first frequency transform circuit to which the output of said first voltage controlled oscillator is connected;

a first phase detector to a first input of which the output of said first frequency transform circuit is connected, and to a second input of which a first reference signal is connected;

a first charge pump circuit to which the output of said first phase detector is connected;

a first loop filter to which the output of said first charge pump circuit is connected, wherein the output of said first loop filter is connected to a frequency control terminal of said first voltage controlled oscillator;

a first counter circuit connected to said first voltage controlled oscillator, the first counter circuit configured to count the output of said first voltage controlled oscillator;

a first accumulator circuit connected to said first counter circuit, the first accumulator configured to integrate the output of said first counter circuit; and a first loop characteristics detection circuit that detects the loop characteristics of the phase locked loop circuit based on the result obtained by integrating the output of said first counter circuit through said first accumulator circuit.

11. A loop characteristics detector circuit, comprising: a first voltage controlled oscillator;

a first frequency transform circuit;

a first phase detector to a first input of which the output of said first frequency transform circuit is connected and to a second input of which a first reference signal is connected;

a first charge pump circuit to which the output of said first phase detector is connected;

a first loop filter to which the output of said first phase detector, the output of said first loop filter being connected to the frequency control terminal of said first voltage controlled oscillator;

a first counter circuit connected to said first voltage controlled oscillator, the first counter circuit configured to count the output of said first voltage controlled oscillator; and a first accumulator circuit connected to said first counter circuit, the first accumulator configured to integrate the output of said first counter circuit, wherein said loop characteristics is detected based on the integral result of said first counter circuit output that was integrated in said accumulator circuit.

* * * * *